(12) United States Patent  (10) Patent No.: US 6,781,532 B2
Wei  (45) Date of Patent: Aug. 24, 2004

(54) SIMPLIFIED MULTI-OUTPUT DIGITAL TO ANALOG CONVERTER (DAC) FOR A FLAT PANEL DISPLAY

(75) Inventor: Zhinan (Peter) Wei, San Jose, CA (US)

(73) Assignee: Elantec Semiconductor, Inc., Milpitas, CA (US)

( * ) Notice: Subject to any disclaimer, the term of this patent is extended or adjusted under 35 U.S.C. 154(b) by 54 days.

(21) Appl. No.: 10/236,211

(22) Filed: Sep. 5, 2002

(65) Prior Publication Data

US 2003/0043060 A1 Mar. 6, 2003

Related U.S. Application Data

(60) Provisional application No. 60/317,581, filed on Sep. 5, 2001.

(51) Int. Cl.[7] .................................................. H03M 1/00
(52) U.S. Cl. ........................................ 341/122; 341/144
(58) Field of Search ............................... 341/122, 144, 341/169.1, 368.12; 345/98, 99

(56) References Cited

U.S. PATENT DOCUMENTS

| | | | |
|---|---|---|---|
| 3,619,511 A | 11/1971 | Ishikawa | 370/202 |
| 4,455,754 A | 6/1984 | Benjamin | 33/537 |
| 4,860,354 A | 8/1989 | van Roermund | 381/7 |
| 5,059,872 A | 10/1991 | Matsumi | 315/368.12 |
| 5,170,158 A | 12/1992 | Shinya | 340/800 |
| 5,877,719 A * | 3/1999 | Matsui et al. | 341/155 |
| 5,977,940 A * | 11/1999 | Akiyam | 345/94 |
| 6,049,321 A | 4/2000 | Sasaki | 345/99 |
| 6,108,119 A * | 8/2000 | Devenport et al. | 359/248 |
| 6,144,354 A | 11/2000 | Koyama | 345/98 |
| 6,404,135 B1 * | 6/2002 | Shino | 315/169.1 |

FOREIGN PATENT DOCUMENTS

CN  529299  10/2000

OTHER PUBLICATIONS

Lee, "Liquid Crystal Display and Driving Device Thereof", US application No. 10/287,916, filed on Nov. 5, 2002.*

* cited by examiner

Primary Examiner—Jean Bruner Jeanglaude
(74) Attorney, Agent, or Firm—Fliesler Meyer LLP

(57) ABSTRACT

A method and apparatus for generating reference voltages for a flat panel display system using a digital to analog converter (DAC) to supply multiple reference voltages to the flat panel display system. The DAC is adapted to accept digital input voltage reference from one of a plurality of registers and to provide an analog output to one of a plurality of sample and hold circuits. A controller selects which one of the plurality of registers is coupled to the DAC input, and selects which one of the plurality of sample and hold circuits is coupled to the DAC output.

20 Claims, 3 Drawing Sheets

US 6,781,532 B2

SIMPLIFIED MULTI-OUTPUT DIGITAL TO ANALOG CONVERTER (DAC) FOR A FLAT PANEL DISPLAY

CLAIM OF PRIORITY

This application claims priority to U.S. Provisional Patent Application No. 60/317,581, filed on Sep. 5, 2001.

CROSS REFERENCE TO RELATED APPLICATION

The following application is being filed simultaneously herewith; ANALOG DEMULTIPLEXER, U.S. Application Ser. No. 10/236,340 Inventor; Chor-Yin Chia, filed on Sep. 5, 2002. This patent application is hereby incorporated herein by this reference in its entirety.

FIELD OF THE DISCLOSURE

The present invention disclosure relates to the field of reference voltage generators, in particular, reference voltage generators for use with flat panel display devices.

BACKGROUND

In conventional flat panel display systems, such as liquid crystal display (LCD) systems, the brightness of each pixel or element is controlled by a transistor. An active matrix display includes a grid of transistors (e.g., thin film transistors) arranged in rows and columns. A column line is coupled to a drain or a source associated with each transistor in each column. A row line is coupled to each gate associated with the transistors in each row. A row of transistors is activated by providing a gate control signal to the row line which turns on each transistor in the row. Each activated transistor in the row then receives an analog voltage value from its column line to cause it to emit a particular amount of light. Generally speaking, a column driver circuit provides the analog voltage to the column lines so that the appropriate amount of light is emitted by each pixel or element. The resolution of a display is related to the number of distinct brightness levels. For a high quality display, a multi-reference voltage buffer (e.g., eight or more voltages) is needed to supply voltages to the column driver.

FIG. 1 shows a simplified block diagram of a flat panel display 2, along with its driver circuitry. The driver circuitry includes a column driver 4, which obtains analog voltages from multi-reference voltage buffer 6. Although FIG. 1 shows the driver circuitry logically separate from the flat panel display 2, commercial flat panel displays typically combine the display and the driver circuitry into a single, thin package. Therefore, a major consideration in developing circuitry for such displays is the microchip die size required to implement such logic.

To achieve multi-reference voltage outputs, digital to analog converters (DAC's) can be used to generate different voltages. Capacitors can be coupled to the DAC's to temporarily buffer the voltages. Such a multi-reference voltage circuit has been conventionally implemented in several ways. One way uses a multi-DAC structure as shown in FIG. 2 wherein one DAC is used to drive a buffer for each channel. DAC circuits are very large, however. With such a multi-DAC structure, as the number of outputs increase the chip die size will become undesirably large. Another way of implementing a multi-reference voltage buffer is to use a resistor or capacitor ladder with a switching network as illustrated in FIG. 3. Because all outputs operate independently, for an N-bit converter with M outputs, $M \cdot 2^N$ switches are needed. Thus, the number of switches required can occupy an undesirably large space. What is needed is a multi-reference voltage buffer small enough to be used in flat panel display packages.

DETAILED DESCRIPTION

Figure 1:
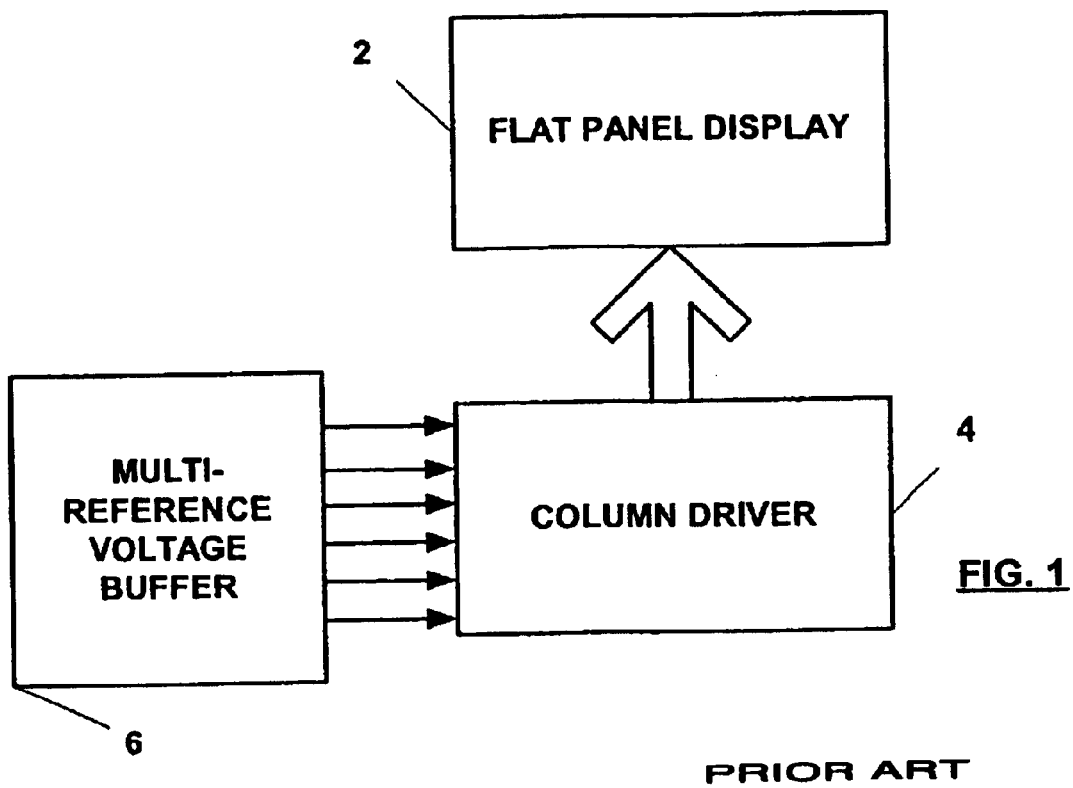
FIG. 1 is a block diagram of a generic flat panel display system.
Figure 2:
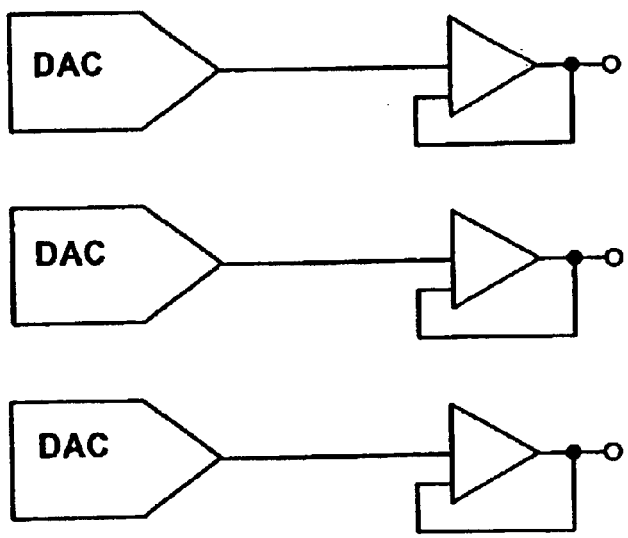
FIG. 2 is a block diagram of a prior art multi-reference voltage buffer.
Figure 3:
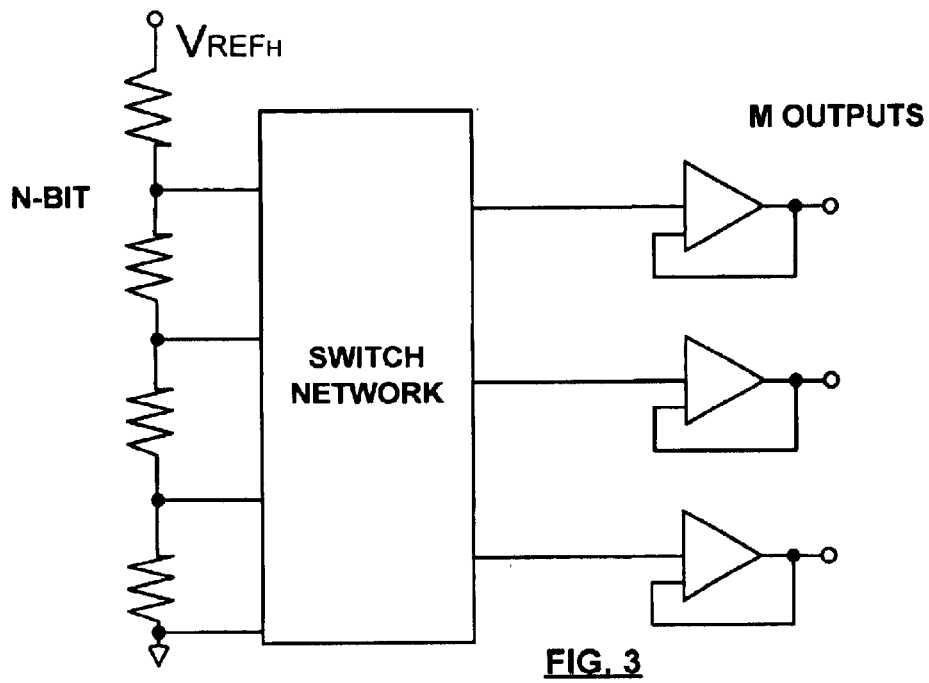
FIG. 3 is a block diagram of another prior art multi-reference voltage buffer.
Figure 4:
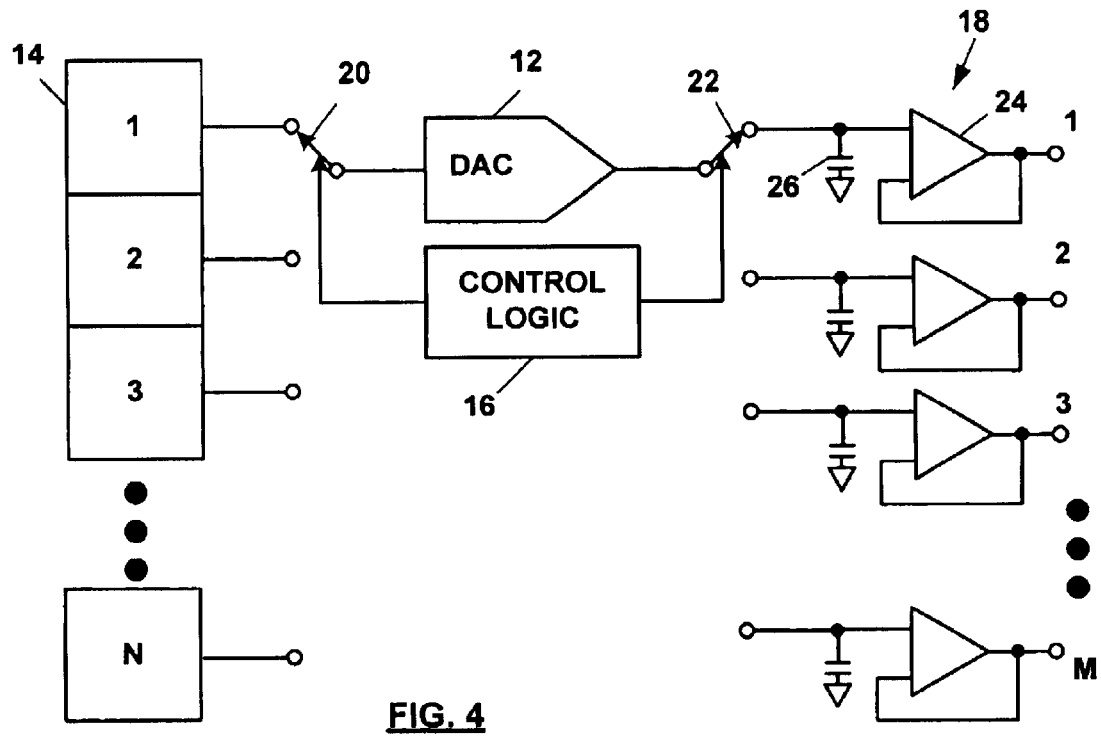
FIG. 4 is a block diagram of one embodiment of the present invention.

FIG. 4 is a block diagram of one embodiment of the present invention. In one embodiment, by way of illustration, a single DAC 12 can be used with N registers 14 and M sample and hold circuits 18 to provide M multi-reference voltage outputs. The M multi-reference outputs are used as input to a column driver (not shown) or similar apparatus for driving a flat panel display (not shown). In operation, DAC 12 obtains a digital data input from one of the DAC registers 14 and then outputs a corresponding analog voltage to one of the sample and hold circuits 18. M can be any integer. Each DAC register 14 is k bits wide. In one embodiment, k can be ten. In another embodiment, k can be any even number. Because a single DAC is used, the circuitry is small in comparison to the multi-DAC structure of FIG. 2, or in comparison to the large switch network of FIG. 3.

Control logic 16 determines which register 14 and sample and hold circuit 18 are selectively coupled to DAC 12. Control logic 16 programs switching terminals (multiplexors or similar devices) 20 and 22 to connect the appropriate register and sample and hold circuit to DAC 12. Once connected, DAC 12 accepts an integer stored in the register and converts it into an analog voltage that is output to the sample and hold circuit. Registers can be set independently. Although any register 14 can be associated with any sample and hold circuit 18, in one embodiment a given register will always be associated with the same sample and hold circuit. A sample and hold circuit (e.g., a capacitor or similar circuit element used to store a charge) can retain a charge for a limited amount of time before the charge begins to degrade. In one embodiment, the control logic 16 cycles through pairs of registers and sample and hold circuits, connecting them to DAC 12. In this way, the sample and hold circuits 18 continually maintain their charges. The control circuitry further provides a refresh to avoid voltage drift on the hold capacitor. If the refresh rate is fast enough, constant and accurate multi-buffered outputs can be obtained.

In one embodiment, each of the M sample and hold circuits 18 comprises an amplifier 24 and a capacitor 26. A first input of the amplifier 24 forms the sample and hold circuit input. A second input and output of the amplifier 24 are connected together. The capacitor 26 connects a first input of the amplifier 24 to ground.

Figure 5:
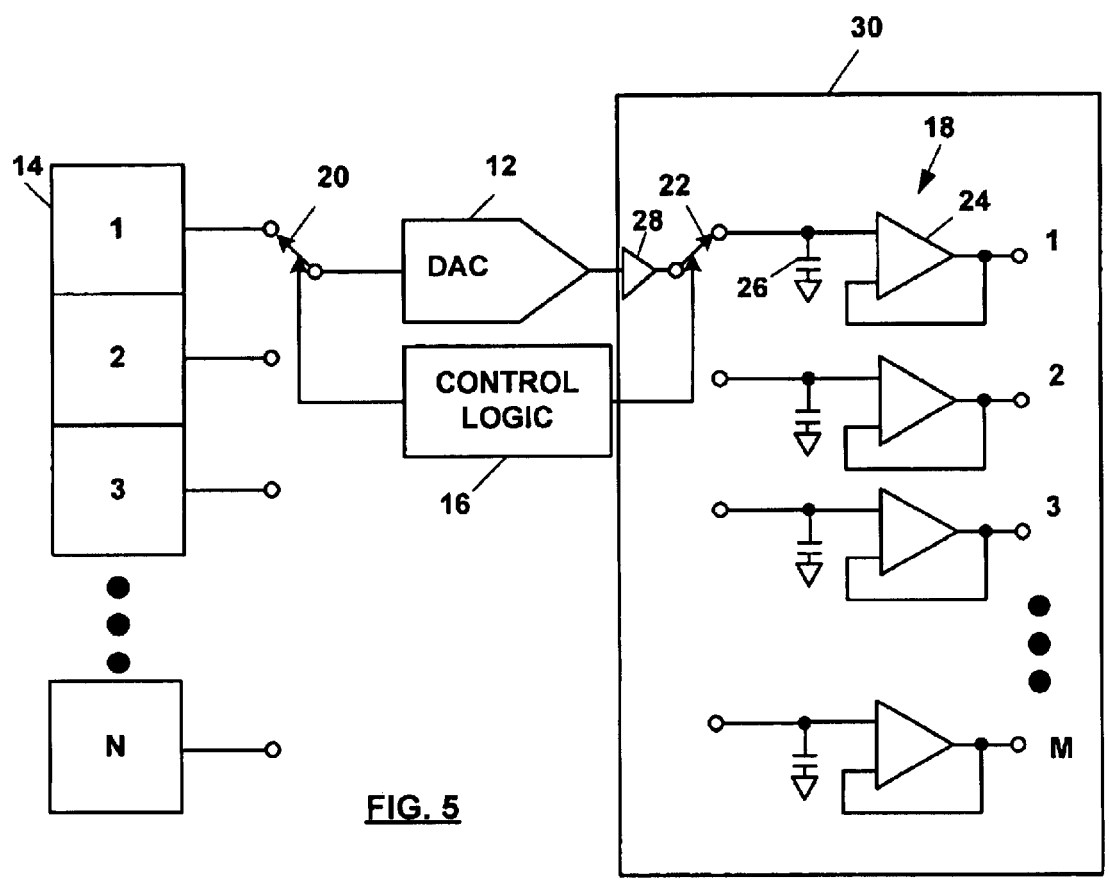
FIG. 5 is a block diagram of another embodiment of the present invention.

FIG. 5 is a block diagram of another embodiment of the present invention. This embodiment includes an input amplifier 28 to form an output demultiplexer circuit 30.

Output demultiplexer circuits are described in the cross-referenced application Ser. No. 10/236,340. In one embodiment, output demultiplexer 30 of FIG. 5 can be implemented using the circuit of FIG. 6 of the cross-referenced application, Ser. No. 10/236,340. It is to be understood that all circuitry of the present invention can be included on a single chip.

The foregoing description of the preferred embodiments of the present invention has been provided for the purposes of illustration and description. It is not intended to be exhaustive or to limit the invention to the precise forms disclosed. Many modifications and variations will be apparent to the practitioner skilled in the art. Embodiments were chosen and described in order to best describe the principles of the invention and its practical application, thereby enabling others skilled in the art to understand the invention, the various embodiments and with various modifications that are suited to the particular use contemplated. It is intended that the scope of the invention be defined by the following claims and their equivalents.

What is claimed is:

1. A reference voltage generator for a flat panel display system, comprising:
   a digital to analog converter (DAC) having an input and an output;
   a plurality of registers, each of which is selectively coupled to the DAC input;
   a plurality of sample and hold circuits, each of which is selectively coupled to the DAC output; and
   a controller to select which one of the plurality of registers is coupled to the DAC input, and to select which one of the plurality of sample and hold circuits is coupled to the DAC output.

2. The reference voltage generator of claim 1 wherein:
   the plurality of sample and hold circuits are coupled to at least one column driver.

3. The reference voltage generator of claim 2 wherein:
   the at least one column driver is coupled to a flat panel display.

4. The reference voltage generator of claim 1 wherein:
   the controller refreshes at least one of the plurality of sample and hold circuits; and
   wherein the controller refreshes the at least one of the plurality of sample and hold circuits such that charges held by the at least one of the plurality of sample and hold circuits are maintained for a predetermined period of time.

5. A reference voltage generator for a flat panel display system, comprising:
   a digital to analog converter (DAC) having an input and an output;
   registers;
   sample and hold circuits;
   a first switch with a common terminal coupled to the DAC input and switching terminals each coupled to one of the registers, the first switch to selectively couple one of the registers to the DAC input; and
   a second switch with a common terminal coupled to the DAC output and switching terminals each coupled to one of the sample and hold circuits, the second switch to selectively couple one of the sample and hold circuits to the DAC output.

6. The reference voltage generator of claim 5 wherein each of the sample and hold circuits comprises:
   an amplifier having a first input forming the sample and hold circuit input, and having a second input and output connected together; and
   a capacitor connecting the first input of the amplifier to ground.

7. The reference voltage generator of claim 5, further comprising:
   a controller; and
   wherein the controller selects which one of the plurality of registers is coupled to the switching terminals of the first switch, and wherein the controller selects which one of the plurality of sample and hold circuits is coupled to the switching terminals of the second switch.

8. The reference voltage generator of claim 5 wherein:
   the sample and hold circuits are coupled to at least one column driver.

9. The reference voltage generator of claim 8 wherein:
   the at least one column driver is coupled to a flat panel display.

10. The reference voltage generator of claim 7 wherein:
    the controller refreshes at least one of the sample and hold circuits; and
    wherein the controller refreshes the at least one of the sample and hold circuits such that charges held by the at least one of the sample and hold circuits are maintained for a predetermined period of time.

11. The reference voltage generator of claim 5 wherein: registers can be updated independent from one another.

12. A method for providing reference voltages to a flat panel display system, comprising:
    using a digital to analog converter (DAC) to supply multiple reference voltages to the flat panel display system; and
    wherein the DAC is adapted to accept digital input from a selected one of a plurality of registers and is adapted to provide analog output to a selected one of a plurality of sample and hold circuits.

13. The method of claim 12 wherein:
    the plurality of sample and hold circuits are coupled to at least one column driver.

14. The method of claim 13 wherein:
    the at least one column driver is coupled to a flat panel display.

15. The method of claim 12, further comprising:
    directing the DAC using a controller.

16. The method of claim 15 wherein:
    the controller refreshes at least one of the plurality of sample and hold circuits; and
    wherein the controller refreshes the at least one of the plurality of sample and hold circuits such that charges held by the plurality of the at least one of the plurality of the sample and hold circuits are maintained for a predetermined period of time.

17. For use in an environment including a plurality registers, a digital to analog converter (DAC), and a plurality of sample and hold circuits, a method useful for providing reference voltages to a flat panel display system, comprising:
    (a) selectively coupling an input of the DAC to one of the plurality of registers, such that the DAC accepts a digital input from the one of the plurality of registers; and (b) selectively coupling an output of the DAC to one of the plurality of sample and hold circuits, such that the DAC provides an analog output to the one of the plurality of sample and hold circuits.

18. The method of claim 17, wherein step (a) includes using a switch to perform the selective coupling, the switch having a common terminal coupled to the input of the DAC and switching terminals, each one coupled to one of the registers.

19. The method of claim 18, wherein step (b) including using a further switch to perform the selectively coupling, the further switch having a further common terminal coupled the output of the DAC and further switching terminals, each coupled to one of the sample and hold circuits.

20. The method of claim 17, wherein step (b) including using a switch to perform the selectively coupling, the switch having a common terminal coupled the output of the DAC and switching terminals, each coupled to one of the sample and hold circuits.

* * * * *

UNITED STATES PATENT AND TRADEMARK OFFICE
CERTIFICATE OF CORRECTION

PATENT NO. : 6,781,532 B2
DATED : August 24, 2004
INVENTOR(S) : Zhinan Wei

It is certified that error appears in the above-identified patent and that said Letters Patent is hereby corrected as shown below:

<u>Column 4,</u>
Line 52, between "held by" and "the at least one of the plurality" delete "the plurality of".
Line 55, between "plurality" and "registers" insert -- of --.

<u>Column 5,</u>
Line 11, delete "selectively" and insert therefor -- selective --.

<u>Column 6,</u>
Line 2, between "coupled" and "the" insert -- to --.
Line 6, delete "selectively" and insert therefor -- selective --.
Line 7, between "coupled" and "the" insert -- to --.

Signed and Sealed this

Fourteenth Day of December, 2004

JON W. DUDAS
*Director of the United States Patent and Trademark Office*